United States Patent
Lin et al.

(10) Patent No.: US 7,911,238 B2
(45) Date of Patent: Mar. 22, 2011

(54) METHOD OF USING A SWITCH CIRCUIT IN-PHASE SWITCHING CLOCK SIGNALS

(75) Inventors: Michael Lin, Hsin Tien (TW); Chi Chang, Hsin Tien (TW)

(73) Assignee: Via Technologies, Inc., Hsin Tien, Taipei Hsien (TW)

( * ) Notice: Subject to any disclaimer, the term of this patent is extended or adjusted under 35 U.S.C. 154(b) by 204 days.

(21) Appl. No.: 10/958,364

(22) Filed: Oct. 6, 2004

(65) Prior Publication Data

US 2005/0077926 A1  Apr. 14, 2005

(30) Foreign Application Priority Data

Oct. 9, 2003 (TW) ................................ 92128142 A

(51) Int. Cl.
*G06F 1/08* (2006.01)
(52) U.S. Cl. ........................................................ 327/99
(58) Field of Classification Search .................. 327/99, 327/407, 216–218
See application file for complete search history.

(56) References Cited

U.S. PATENT DOCUMENTS

| | | | | |
|---|---|---|---|---|
| 5,483,185 A * | 1/1996 | Scriber et al. | ................... | 327/99 |
| 5,768,624 A * | 6/1998 | Ghosh | ............................ | 710/53 |
| 5,818,366 A * | 10/1998 | Morley | ........................ | 341/101 |
| 6,043,692 A * | 3/2000 | Linoff | ........................... | 327/117 |
| 6,067,334 A * | 5/2000 | Bostica et al. | ................ | 375/373 |
| 6,188,723 B1 * | 2/2001 | Lee et al. | ....................... | 375/235 |
| 6,243,031 B1 * | 6/2001 | Jusuf et al. | ..................... | 341/68 |
| 6,265,930 B1 * | 7/2001 | Walker et al. | ................. | 327/407 |
| 6,278,307 B1 * | 8/2001 | El-Kik | ........................... | 327/175 |
| 6,300,809 B1 * | 10/2001 | Gregor et al. | ................ | 327/200 |
| 6,452,423 B1 * | 9/2002 | Das et al. | ...................... | 326/113 |
| 6,496,050 B2 * | 12/2002 | Lloyd | ........................... | 327/407 |
| 6,600,355 B1 * | 7/2003 | Nguyen | ........................ | 327/298 |
| 6,943,605 B2 * | 9/2005 | Thadikaran et al. | .......... | 327/218 |
| 7,715,501 B2 * | 5/2010 | Stojanovic et al. | .......... | 375/340 |
| 2002/0067788 A1 * | 6/2002 | Gregorian et al. | ............ | 375/376 |

* cited by examiner

*Primary Examiner* — Lincoln Donovan
*Assistant Examiner* — Khareem E Almo
(74) *Attorney, Agent, or Firm* — Thomas, Kayden, Horstemeyer & Risley, LLP

(57) ABSTRACT

A switch circuit for switching two clock signals includes a clock generator, a flip-flop and a multiplexer. The clock generator is to generate a reference signal whose cycle is the lowest common multiple of the cycles of the two clock signals. The flip-flop is to generate a selecting signal by taking a control signal from system as an input signal and taking the reference signal as a timing trigger signal. The multiplexer can output a selected clock signal according to the selecting signal in which the selected clock signal and the switched clock signal are synchronous during their entire cycles.

5 Claims, 4 Drawing Sheets

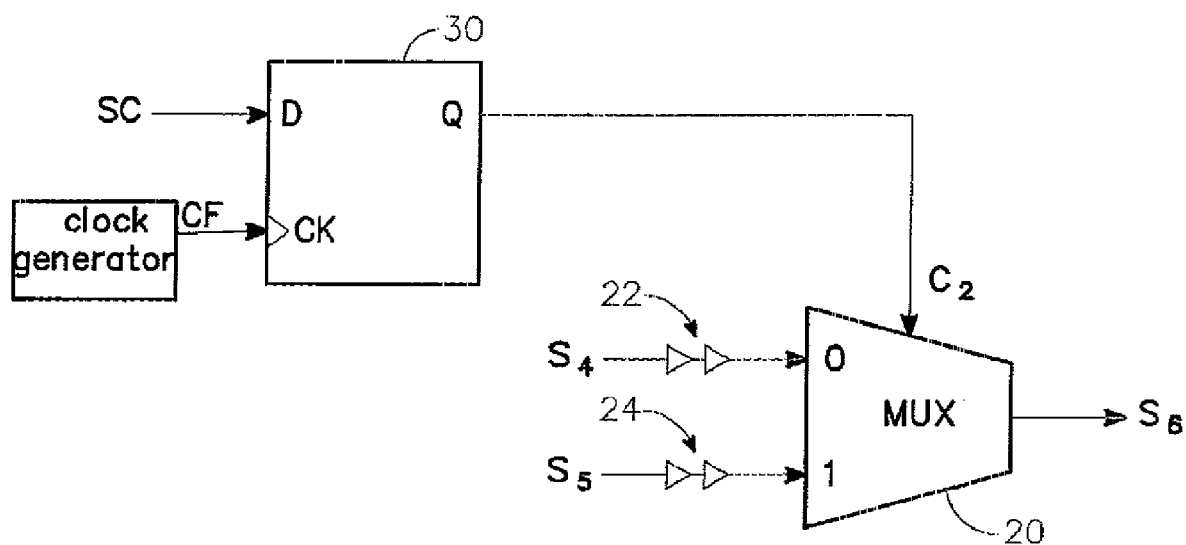
F I G . 3
| CK | D | Q |
|---|---|---|
| ⤒ | 0 | 0 |
| ⤒ | 1 | 1 |
F I G . 4

METHOD OF USING A SWITCH CIRCUIT IN-PHASE SWITCHING CLOCK SIGNALS

BACKGROUND OF THE INVENTION (1) Field of the Invention

The invention relates to a circuit, and more particularly to a switch circuit for switching clock signals.

(2) Description of the Prior Art

The advance in computer technology, especially in personal computers (PCs), has brought a lot of conveniences to our daily life. Nowadays, a personal computer becomes an inevitable part in our daily living, for a major part of our day-to-day chores such as searching information, gathering news over the network and so on does highly rely on the PC. The personal computer generally includes a motherboard and a plurality of IC chips mounted on the motherboard. For a computer user, quality and stability are the most wanted to a motherboard. Therefore, in order to keep a substantial market share, computer manufacturers have been endeavoring to improve the quality and stability of the motherboard.

On the motherboard, a clock generator is included to provide clock signals for system operation. In early days, clock generators are made by oscillators. However, different frequencies in clock signals are needed for operating the motherboard such that oscillators to generate signals of various frequencies can be seen in distinct areas on the motherboard. In the latest art, these oscillators are integrated into one single chip for providing clock signals with various frequencies. Therefore, upon a request from the system to switch between different clock signals, a 2-to-1 multiplexer 10 (MUX) is introduced to switch clock signals $S_1$ and $S_2$ as shown in FIG. 1.

FIG. 2 shows a clock switching timing diagram according to FIG. 1. It is assumed that frequencies of $S_1$ and $S_2$ are 200 MHz and 250 MHz, respectively. When the system outputted a control signal $C_1$ to switch clock signal ($S_1$ is the original clock signal), the logic level of control signal $C_1$ would change from "low" to "high" at time "t" such that the output clock signal $S_3$ can vary from $S_1$ to $S_2$ simultaneously.

In an ideal situation, as the multiplexer 10 changed the clock signal at time "t", the frequency of output clock signal $S_3$ (maintained at the frequency of $S_1$ before clock switching at t) is then changed to the frequency of $S_2$ after the clock switching at t. It should be noted that the duty cycle of the output clock signal $S_3$ in the timing period of t can no longer remain at 50% ($t_p > t_n$). Thus, a glitch is occurred and error functions are followed at where the circuits adopted the defected clock signal as a reference clock signal. Therefore, the present invention provides a design of signal switching circuit so as to maintain a stable signal output at the moment of signal switching.

SUMMARY OF THE INVENTION

Accordingly, it is one object of the present invention to provide a design of signal switching circuit.

It is one more object of the present invention to provide a circuit for switching clock signals.

According to the present invention, the switch circuit for mutually switching two clock signals includes a clock generator, a D-type flip-flop and a multiplexer. The clock generator is for generating a reference signal and the cycle of the reference signal is the lowest common multiple of the cycle of the aforesaid two clock signals. The D-type flip-flop who takes a control signal from system as its input signal and the reference signal as its timing trigger signal is for generating a selecting signal. The D-type flip-flop which can be triggered by a positive edge or a negative edge of a specific clock pulse can be chosen from a group of RS flip-flops, JK flip-flops, master-slave flip-flops, D-type flip-flops, and T-type flip-flops. The multiplexer can output a selected clock signal according to the selecting signal in which the selected clock signal and the switched clock signal are synchronous during their entire cycles.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and in which:

FIG. 3 is a schematic view of a preferred embodiment of the present invention;

FIG. 4 is a characteristic table for the D-type flip-flop;

DESCRIPTION OF THE PREFERRED EMBODIMENT

The invention disclosed herein is to generate clock signals and the cycle of the clock signals is the lowest common multiple of the cycles for switched clock signals. Additionally, a selecting signal generated by a multiplexer is cooperated for controlling the multiplexer to output a correct clock signal. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

FIG. 3 shows a schematic view of a preferred switch circuit in accordance with the present invention. The switch circuit includes a multiplexer 20 and a D-type flip-flop 30. In this embodiment, two clock signals ($S_4$ and $S_5$) are to be switched by a 2-to-1 multiplexer 20 in the switch circuit. A selecting signal $C_2$ came from the D-type flip-flop 30 is used to determine the output signal $S_6$. Consequently, if the logical level of the selecting signal $C_2$ is "low", then the clock signal $S_4$ is outputted from the multiplexer 20. On the contrary, if the logical level of the selecting signal $C_2$ goes to "high", then the multiplexer 20 outputs the clock signal $S_5$ instead.

As shown, the D-type flip-flop 30 has a input D, a clock signal CK, and a output Q. FIG. 4 shows a characteristic table for the D-type flip-flop 30 of FIG. 3. In the present embodiment, the D-type flip-flop 30 is triggered while hitting the positive edge of the clock pulse. That is to say that the input signal is sampled from the input terminal D and sent directly to the output terminal Q as soon as the CK pulse hits the positive edge. As shown in FIG. 4, it is noted that the values in the D and the Q are the same while the CK meets the positive edge of the pulse. Alternatively, in the present invention, the D-type flip-flop 30 can also be designed to be triggered at the negative edge.

In the embodiment as shown in FIG. 3, the D-type flip-flop 30 has a control signal SC received from the system as an input signal at D and as a control signal for switching the clock signals. The reference signal CF at CK can be also used to serve as a clock trigger signal for the D-type flip-flop 30 to generate a selecting signal $C_2$ so as to control the output $S_6$ of the multiplexer 20. The reference signal CF can be generated from the clock generator of the system and the cycle of the reference signal CF can be the lowest common multiple of the corresponding cycles of the two clock signals $S_4$ and $S_5$. For example, in the case that the cycles of the two clock signals $S_4$ and $S_5$ are 5 ns and 4 ns (where $fs_4$=200 MHz, $fs_5$=250 MHz) respectively, then the cycle of the reference signals can be set to 20 ns (frequency equivalent to 50 MHz).

Figure 1:
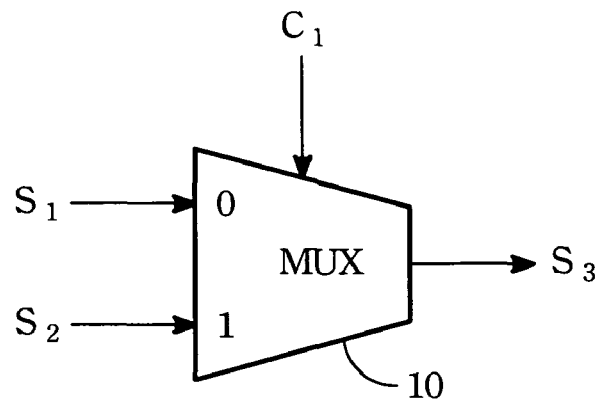
FIG. 1 is a schematic view of a 2-to-1 multiplexer.
Figure 2:
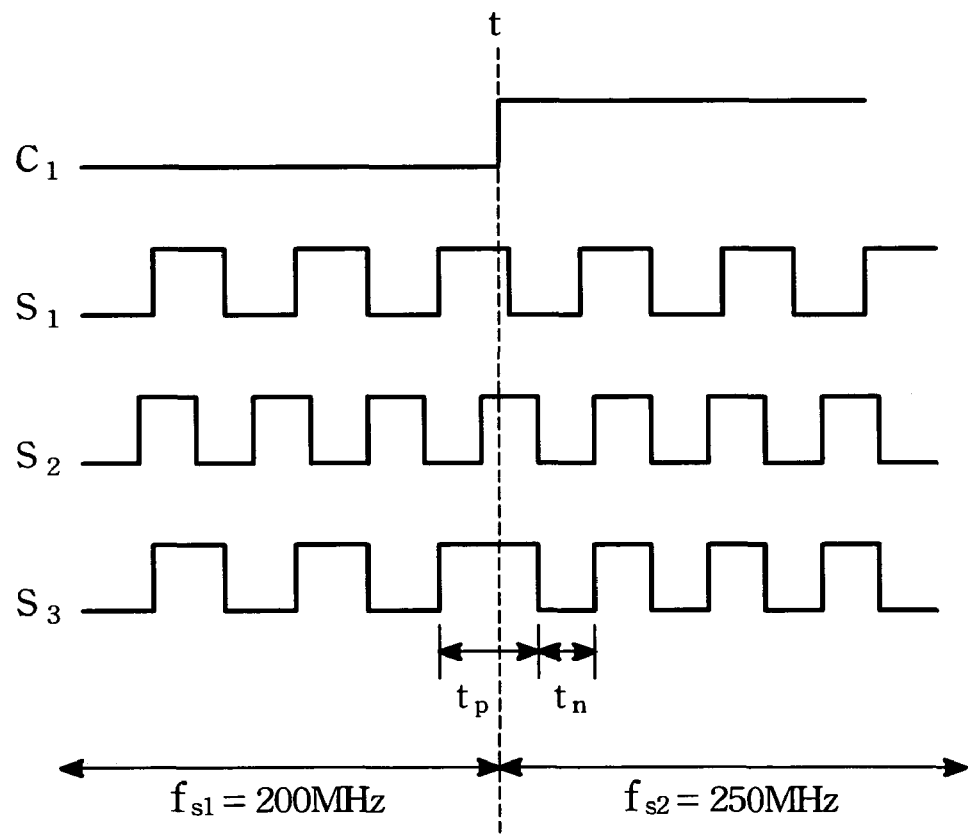
FIG. 2 is a timing diagram for switching clock signals of FIG. 1.
Figure 5:
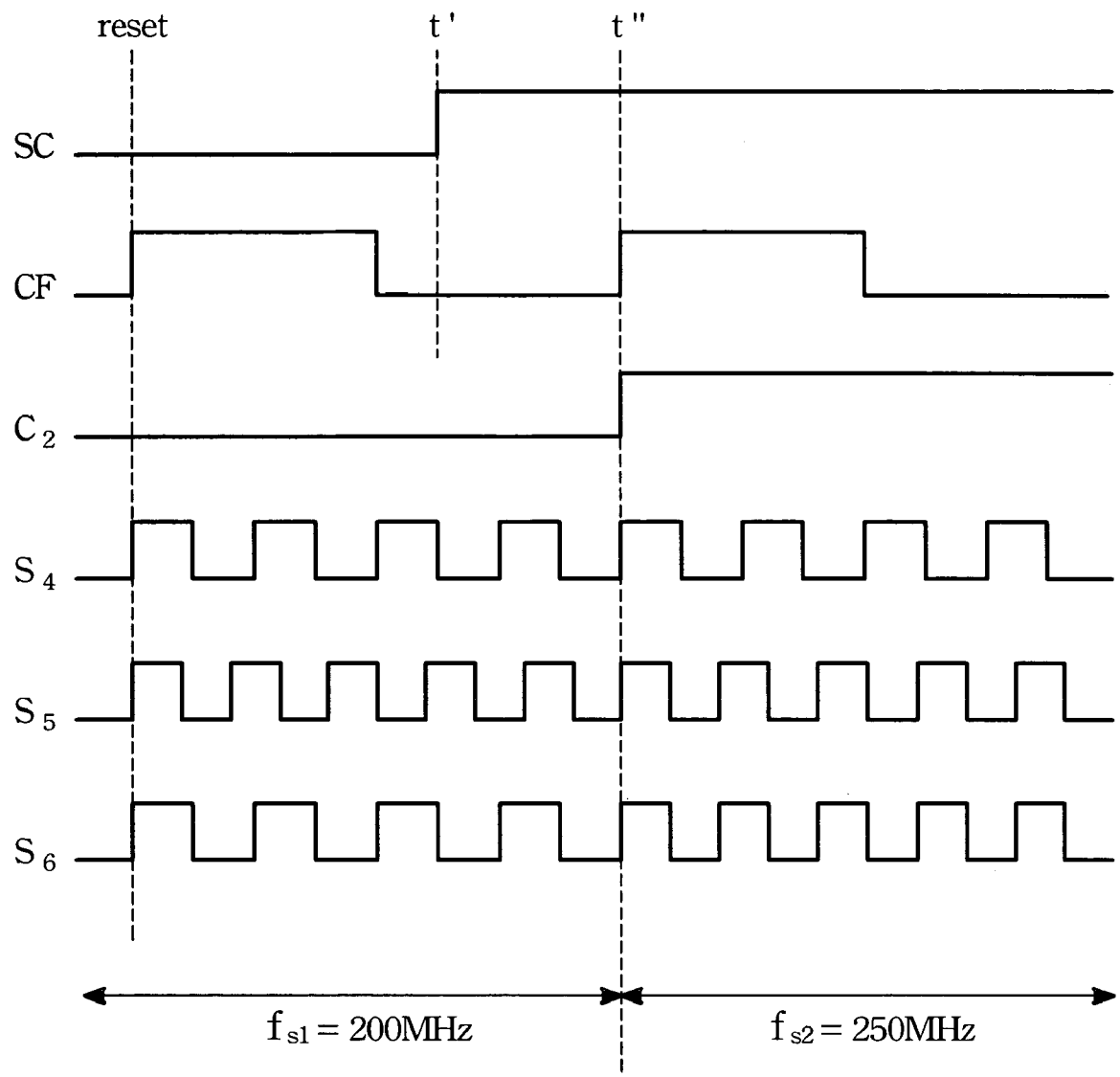
FIG. 5 is a timing diagram for switching clock signals of FIG. 3.

FIG. 5 shows a timing diagram for one embodiment of the present invention in switching clock signals. At the starting point, all related signals such as the reference signal CF, the clock signals $S_4$, $S_5$, $S_6$ are reset so that all these signals can be regulated to start at the same time. At time t', the control signal SC changes from 0 to 1, but the clock trigger signal (also known as the reference signal CF) of the D-type flip-flop 30 is not at a state meeting the rising edge. Therefore, at time t', the D-type flip-flop 30 remains the original state (the selecting signal $C_2$ remains 0) so that the frequency of the output clock signal $S_6$ is still equal to the frequency of signal $S_4$.

At the moment t", the state of the reference signal CF is at the rising edge and so the output Q of the D-type flip-flop 30 would follow the input signal SC to change its state from 0 to 1. Meanwhile, the output signal of multiplexer 20 switches from $S_4$ to $S_5$ according to the control signal $C_2$. It should be noted that the cycle of the reference signals CF ($T_{cF}$=20 ns) is set as the lowest common multiple of the cycles of the two clock signals $S_4$ and $S_5$ ($T_{s4}$=5n's, $T_{s5}$=4 ns). Hence, the clock signal $S_4$ and $S_5$ can proceed their entire cycles synchronously, and the output clock signal $S_6$ can switch from $S_4$ to $S_5$ after one whole cycle of signal $S_4$.

Practically, the D-type flip-flop 30 is consisted of several logic gates. As signals passed through the logic gates, propagation delay would be occurred during signal transmission. Therefore, in the present invention, the selecting signal $C_2$ may be delayed for a period of time before input to the multiplexer 20. Therefore, in order to make sure that the switch circuit can work correctly, the input signals, $S_4$ and $S_5$ of the multiplexer 20 must be delayed for the same period of time (used a delay chain 22,24) so as to meet with the selecting signal $C_2$.

Figure 6:
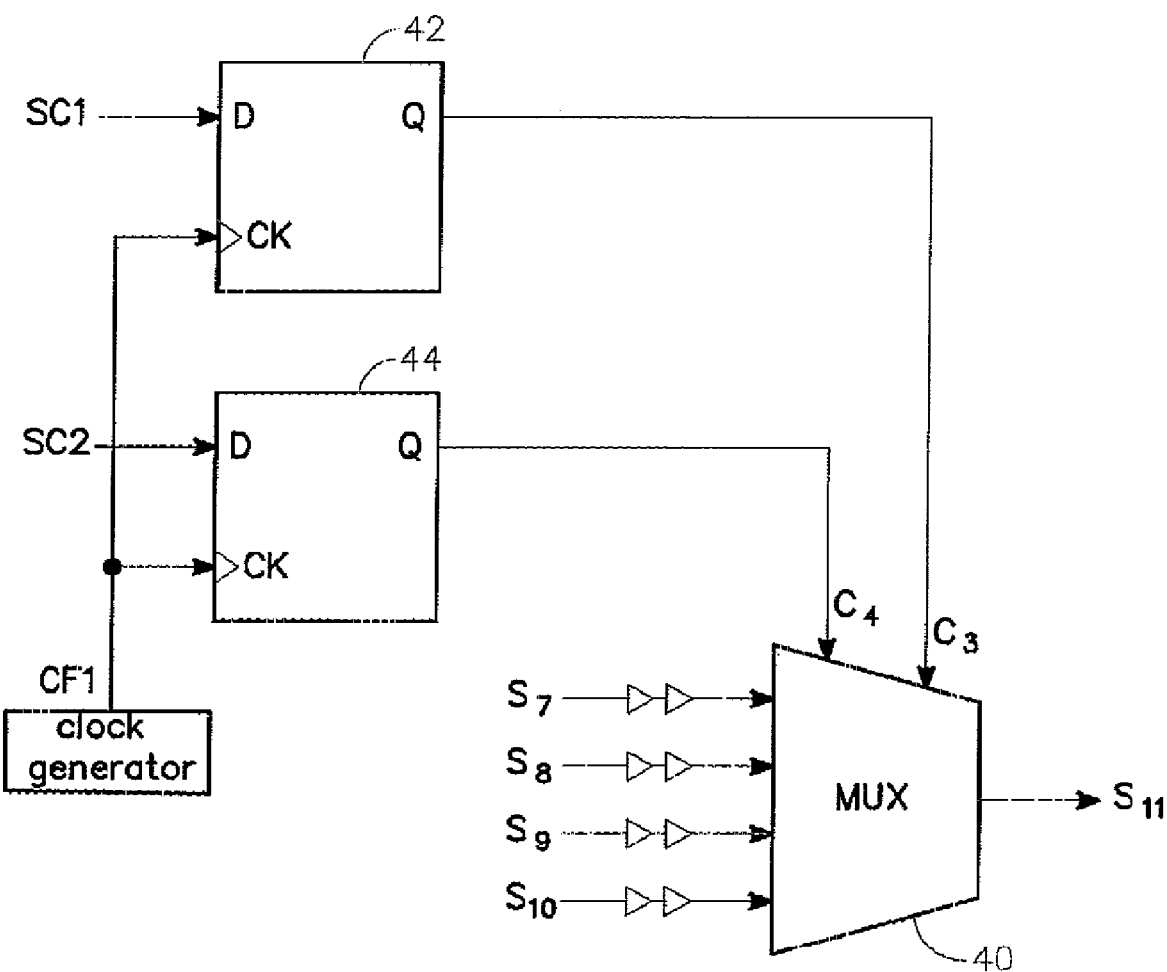
FIG. 6 is a schematic view of another embodiment of the present invention.

In the previous embodiment, two clock signals ($S_4$ and $S_5$) are used as an example for switching demonstration. On the other hand, as shown in FIG. 6, switching among four clock signals ($S_7 \cdot S_8 \cdot S_9 \cdot S_{10}$) with a 4-to-1 multiplexer 40 and two D-type flip-flops 42,B44 is illustrated. In this embodiment, $SC_1$ and $SC_2$ are two control signals forming four combination to control four clock signals ($S_7 \cdot S_8 \cdot S_9 \cdot S_{10}$) respectively and $CF_1$ is the common reference clock signal that the lowest common multiple of cycles of the four signals ($S_7 \cdot S_8 \cdot S_9 \cdot S_{10}$). The control signal $SC_1$, $SC_2$ and reference clock signal $CF_1$ are used to switch these four different clock signals. The switching among signals of this embodiment is resembled to that described above from FIG. 3 through FIG. 5, and so details thereabout will be omitted herein.

In another embodiment of the present invention not shown here, a combination of a 4-to-1 multiplexer, two D-type flip-flops and two control signals can be used to complete the switching among three clock signals.

Inferred from the aforementioned descriptions, to switch k clock signals, it would need a $2^n$-to-1 multiplexer and n flip-flops where $2^{n-1} < k \leq 2^n$, in which both k and n are natural numbers. Furthermore, the number of control signals should be met with the number (n) of flip-flops. For example, the G-th control signal is the input signal of the G-th flip-flop and the G belongs to the nature number from 1 to n. Besides, the cycle of the reference signals should be the lowest common multiple of the cycles of the k clock signals so as to switch among k signals. It should be noted that the foregoing flip-flops can be selected from a group of RS flip-flops, JK flip-flops, master-slave flip-flops, D-type flip-flops, and T-type flip-flops. Definitely, for those skilled in the art, minor modification upon the present invention to meet a practical application is also simply to achieve.

In summary, the switch circuit of the invention provides at least following advantages over the conventional techniques:

(1) The output clock signal output from the switch circuit of the present invention could maintain in a stable state that other circuits adopting the foregoing clock signal as a reference signal could remain in a normal operating state.

(2) The switch circuit of the present invention has advantage in design to be simply designed and easy to achieve so as to reduce the degree of difficulty for the motherboard designers.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

We claim:

1. A method of using a switch circuit in-phase switching clock signals, wherein said switch circuit comprises a D flip-flop and a 2 to 1 multiplexer, said method comprising the steps of:
    receiving a first clock signal and a second clock signal by said 2 to 1 multiplexer;
    receiving a switch control signal by an input terminal of said D flip-flop, wherein said switch control signal is used to determine an output signal of said switch circuit;
    receiving a reference clock signal by a clock terminal of said D flip-flop, wherein a reference period of said reference clock signal is the least common multiple of a first period of said first clock signal and a second period of said second clock signal, and said first period is different from said second period; and
    selectively outputting said first clock signal or said second clock signal as said output signal of said switch circuit by said 2 to 1 multiplexer according to a selecting signal outputted from said D flip-flop,
    wherein said output signal of said switch circuit is switched from said first clock signal to said second clock signal when said reference clock signal is changed from a first voltage level to a second voltage level.

2. The method of using a switch circuit in-phase switching clock signals switch circuit according to claim 1, further comprising delaying said first and second clock signals before inputting to said 2-to-1 multiplexer, so as to balance time delay during signal propagation.

3. A method of using a switch circuit in-phase switching clock signals, wherein said switch circuit comprises a first D flip-flop, a second D flip-flop and a 4 to 1 multiplexer, said method comprising the steps of:

receiving a first clock signal, a second clock signal and a third clock signal by said 4 to 1 multiplexer;

receiving a first switch control signal by a first input terminal of said first D flip-flop and receiving a second switch control signal by a second input terminal of said second D flip-flop, wherein said first and second switch control signals are combined to determine an output signal of said switch circuit;

receiving a reference clock signal by a first clock terminal of said first D flip-flop and a second clock terminal of said second D flip-flop, wherein a reference period of said reference clock signal is the least common multiple of a first period of said first clock signal, a second period of said second clock signal and a third period of said third clock signal, and said first, second and third periods are different; and selectively outputting said first, second or third clock signal as said output signal of said switch circuit by said 4 to 1 multiplexer according to a first selecting signal outputted from said first D flip-flop and a second selecting signal outputted from said second D flip-flop, wherein said output signal of said switch circuit is switched from one of the first, second and third clock signals to another when said reference clock signal is changed from a first voltage level to a second voltage level.

4. The method of using a switch circuit in-phase switching clock signals switch circuit according to claim 3, further comprising:

receiving a fourth clock signal; and selectively outputting said first clock signal, said second clock signal, said third clock signal or said fourth clock signal as the output signal of said switch circuit, and wherein said fourth clock signal having a fourth period different from said first, second and third periods, and said reference period becomes the least common multiple of said first, second, third and fourth periods.

5. The method of using a switch circuit in-phase switching clock signals according to claim 3, further comprising delaying said first, second and third clock signals before inputting to said 4-to-1 multiplexer, so as to balance time delay during signal propagation.

* * * * *